United States Patent
Chae et al.

(10) Patent No.: US 11,163,634 B2
(45) Date of Patent: Nov. 2, 2021

(54) H MATRIX GENERATING CIRCUIT, OPERATING METHOD THEREOF AND ERROR CORRECTION CIRCUIT USING H MATRIX GENERATED BY THE SAME

(71) Applicant: SK hynix Inc., Gyeonggi-do (KR)

(72) Inventors: Chol Su Chae, Gyeonggi-do (KR); Jang Seob Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 715 days.

(21) Appl. No.: 15/871,548

(22) Filed: Jan. 15, 2018

(65) Prior Publication Data
US 2019/0056988 A1 Feb. 21, 2019

(30) Foreign Application Priority Data
Aug. 18, 2017 (KR) .................. 10-2017-0165035

(51) Int. Cl.
*H03M 13/11* (2006.01)
*G06F 11/07* (2006.01)
*H03M 13/00* (2006.01)

(52) U.S. Cl.
CPC ....... *G06F 11/0793* (2013.01); *H03M 13/116* (2013.01); *H03M 13/616* (2013.01)

(58) Field of Classification Search
CPC ............. G06F 11/0793; H03M 13/616; H03M 13/116
USPC ...................................................... 714/781
See application file for complete search history.

(56) References Cited

U.S. PATENT DOCUMENTS

| | | | | |
|---|---|---|---|---|
| 8,464,142 B2* | 6/2013 | Gunnam | ............ | H03M 13/1128 714/781 |
| 8,473,824 B1* | 6/2013 | Chaichanavong | .. | H03M 13/033 714/758 |
| 8,612,835 B2* | 12/2013 | Yokokawa | .............. | G06F 7/762 714/781 |
| 8,689,088 B2* | 4/2014 | Lee | .................... | H03M 13/1188 714/781 |
| 2005/0149833 A1* | 7/2005 | Worley | ............. | H03M 13/6502 714/781 |
| 2013/0086456 A1* | 4/2013 | Yedidia | .............. | H03M 13/1154 714/781 |
| 2015/0200747 A1* | 7/2015 | Petrov | ................. | H03M 13/255 714/776 |
| 2016/0261371 A1* | 9/2016 | Klenner | ............. | H03M 13/1165 |
| 2019/0229751 A1* | 7/2019 | Kim | ....................... | H03M 13/11 |
| 2020/0186167 A1* | 6/2020 | Noh | ......................... | H04L 1/00 |
| 2021/0167800 A1* | 6/2021 | Shin | ..................... | H03M 13/616 |

FOREIGN PATENT DOCUMENTS

AU 2018290395 A1 * 9/2019 .......... H03M 13/618
KR 100949519 3/2010

* cited by examiner

*Primary Examiner* — Albert Decady
*Assistant Examiner* — Enam Ahmed
(74) *Attorney, Agent, or Firm* — IP & T Group LLP

(57) ABSTRACT

An H matrix generating circuit for generating an H matrix of a QC-LDPC code may include: a conversion value calculation unit calculating conversion values corresponding to column sections of an original H matrix including a plurality of circulant matrices; and a shift unit generating an advanced H matrix by circularly shifting circulant matrices positioned in column sections of the original H matrix by amounts of the conversion values, respectively.

10 Claims, 5 Drawing Sheets

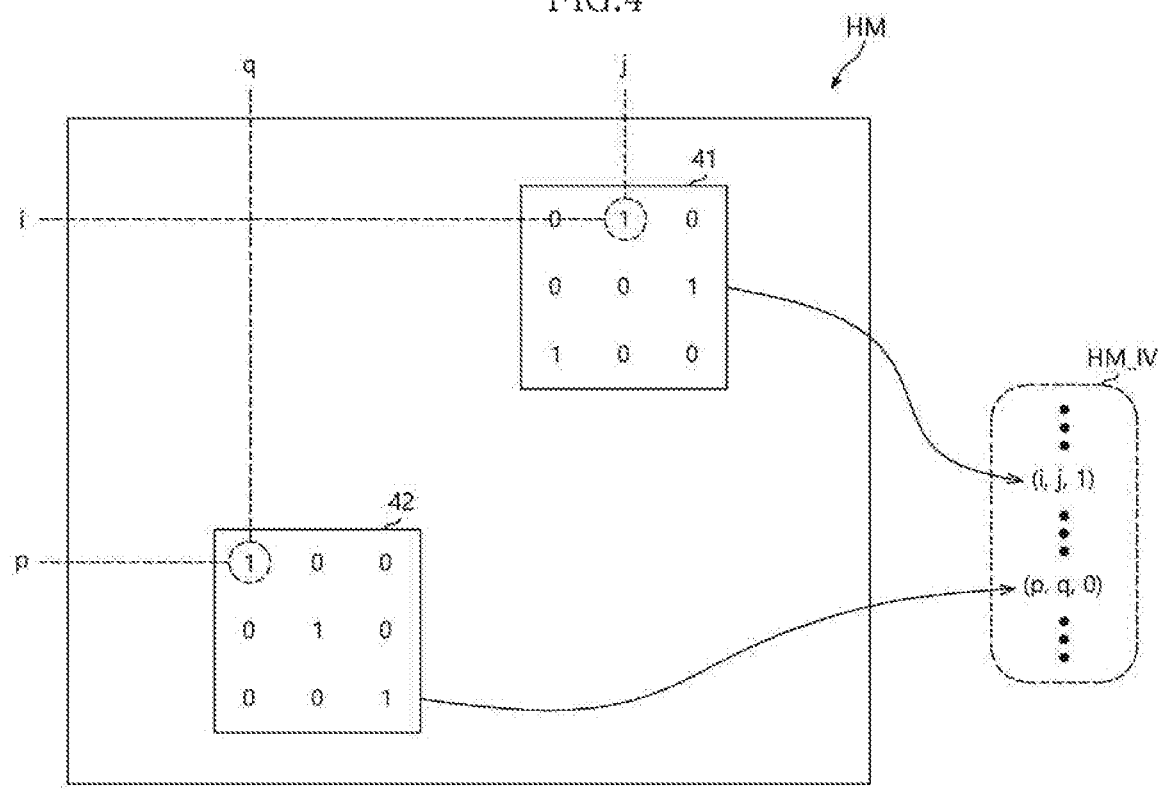

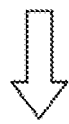

＃ H MATRIX GENERATING CIRCUIT, OPERATING METHOD THEREOF AND ERROR CORRECTION CIRCUIT USING H MATRIX GENERATED BY THE SAME

CROSS-REFERENCES TO RELATED APPLICATION

The present application claims priority under 35 U.S.C. § 119(a) to Korean application number 10-2017-0105035, filed on Aug. 18, 2017, which is incorporated herein by reference in its entirety.

BACKGROUND

1. Technical Field

Various embodiments generally relate to an H matrix generating circuit, and more particularly, to a circuit for generating an H matrix of a Quasi-Cyclic Low Density Parity Check (QC-LDPC) code.

2. Related Art

A data storage device may store data provided from an external device, in response to a write request of the external device. Furthermore, the data storage device may provide data stored therein to the external device, in response to a read request of the external device. The external device may include electric devices such as a computer, digital camera and mobile phone, which are capable of processing data. The data storage device may be embedded in the external device, or separately fabricated and connected to the external device.

The data storage device may include an encoder and decoder. The encoder may encode data transmitted from the external device, and the data storage device may store the data having parity data added thereto through the encoding operation. Moreover, when the external device requests data stored in the data storage device, the decoder may decode the stored data, and the data storage device may transmit the data corrected through the decoding operation to the external device.

SUMMARY

In an embodiment, an H matrix generating circuit for generating an H matrix of a QC-LDDC code may include: a conversion value calculation unit calculating conversion values corresponding to column sections of an original H matrix including a plurality of circulant matrices; and a shift unit generating an advanced H matrix by circularly shifting circulant matrices positioned in column sections of the original H matrix by amounts of the conversion values, respectively.

In an embodiment, there is provided an operating method of an H matrix generation circuit for generating an H matrix of a QC-LDPC code. The operating method may include: calculating conversion values corresponding to column sections of an original H matrix including a plurality of circulant matrices; and generating an advanced H matrix by circularly shifting circulant matrices positioned in column sections of the original H matrix by amounts of the conversion values, respectively.

In an embodiment, an error correction circuit may include: an H matrix storage unit storing H matrix information of a QC-LDPC code; and a decoder suitable for performing a decoding operation on a codeword based on the H matrix information. The H matrix of the QC-LDPC code may include a plurality of circulant matrices, and first circulant matrices of column sections of the H matrix may be set to identity matrices.

In an embodiment, a memory system may include: a memory device; and an ECC unit recovering a first H matrix from H matrix information stored therein, and performing an error-correcting operation for a codeword read from the memory device with the first H matrix, wherein the first H matrix is an array of circulant matrices with first circulant matrices being identity matrices in respective column sections thereof, and wherein the H matrix information includes positions of the first circulant matrices in the respective column sections and positions and shift values of the other circulant matrices of the first H matrix.

BRIEF DESCRIPTION OF THE DRAWINGS

The above and other features and advantages of the present invention will become more apparent to those skilled in the art to which the present invention belongs by describing various embodiments thereof with reference to the attached drawings in which:

FIG. 3 is a diagram for describing the structures of the circulant matrices included in the H matrix.

FIG. 4 is a diagram for describing a method for converting an H matrix into H matrix information.

FIG. 5 is a diagram for describing an operating method of the H matrix generating circuit of FIG. 1.

DETAILED DESCRIPTION

Figure 1:
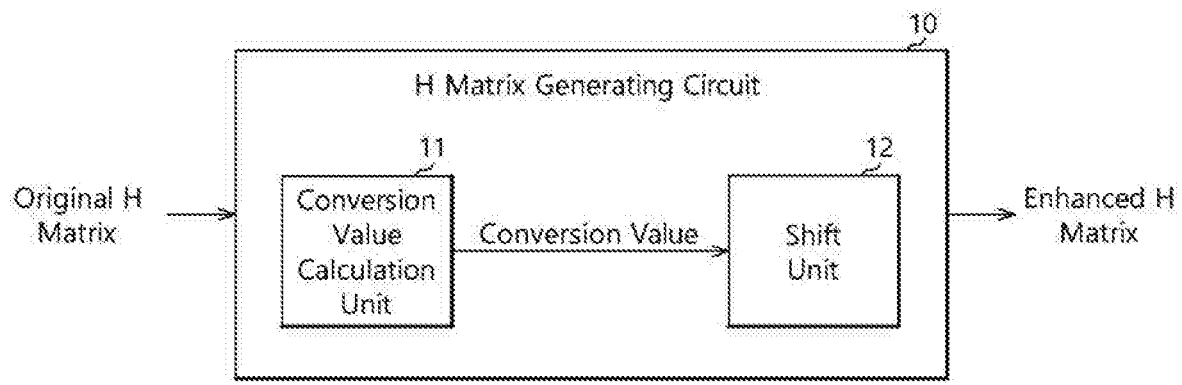
FIG. 1 is a block diagram illustrating an H matrix generating circuit for a generating an advanced H matrix in accordance with an embodiment.

Hereinafter, an h matrix generating circuit, an operating method thereof and an error correction circuit using the h matrix generated by the same according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating an H matrix generating circuit 10 in accordance with an embodiment.

Referring to FIG. 1, the H matrix generating circuit 10 may generate an advanced H matrix by converting an original H matrix. The advanced H matrix may be used for an encoding operation and decoding operation based on a Quasi-Cyclic Low Density Parity Check (QC-LCPC) code. The encoding operation may include generating a codeword by encoding data based on the advanced H matrix, and the decoding operation may include performing a parity check operation on a codeword based on the advanced H matrix, in order to check whether the codeword contains an error.

The H matrix generating circuit 10 may include a conversion value calculation unit 11 and a shift unit 12.

The conversion value calculation unit 11 may calculate conversion values respectively corresponding to column sections of the original H matrix including a plurality of circulant matrices. The conversion value calculation unit 11 may calculate a shift value as a conversion value corresponding to a predetermined column section. The shift value may be used for converting a first circulant matrix of the predetermined column section into an identity matrix through a circular shift of the first circulant matrix.

The shift unit 12 may generate the advanced H matrix including a plurality of circulant matrices. The plurality of circulant matrices of the advanced H matrix may be generated by circularly shifting corresponding circulant matrices of the original H matrix by amounts of corresponding conversion values, respectively. The plurality of identity matrices of the same locations between the advanced H matrix and the original H matrix may correspond to each other, respectively. The shift unit 12 may generate the advanced H matrix, such that first circulant matrices of the respective column sections in the advanced H matrix become the identity matrices.

In accordance with an embodiment of the present disclosure, due to structural nature of the advanced H matrix, the advanced H matrix may have compressed information of the H matrix which contains the positions of the first circulant matrices and the positions and the shift values of the other circulant matrices in the respective column sections. In other words, the advanced H matrix may have compressed information of the H matrix, which is used for recovering all elements of the H matrix, rather than having the whole elements of the H matrix. As described in detail later, the H matrix information may have the same nature as the H matrix, but have a smaller size than the H matrix. In particular, the H matrix information generated by the H matrix generating circuit 10 in accordance with the present embodiment may require lesser memory capacity, because the H matrix information does not include the shift values of the first circulant matrices of the respective column sections in the advanced H matrix.

In an embodiment, the H matrix generating circuit 10 may compress the advanced H matrix into H matrix information including the positions of the first circulant matrices and the positions and the shift values of the other circulant matrices in the respective column sections, and output the H matrix information.

Figure 2:
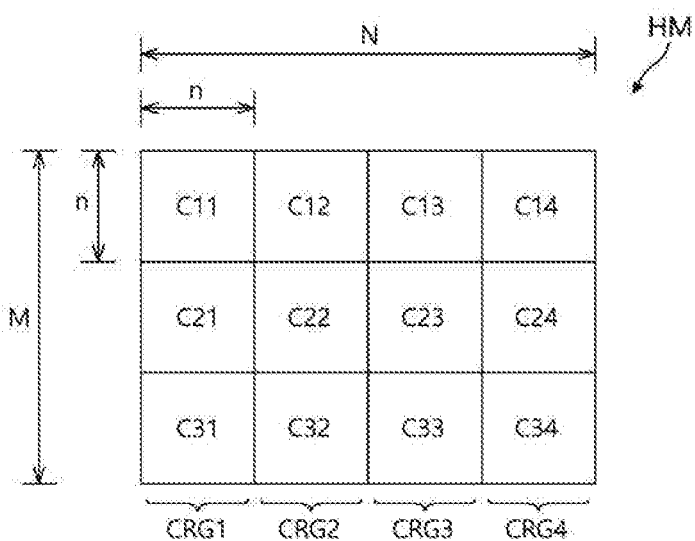
FIG. 2 is a diagram for describing the structure of an H matrix of a QC-LDPC code.

FIG. 2 is a diagram for describing the structure of an H matrix HM of a QC-LDPC code. The original H matrix and the advanced H matrix described with reference to FIG. 1 may be configured in a similar manner to the H matrix HM of FIG. 2.

Referring to FIG. 2, the H matrix HM may include circulant matrices C11 to C34. The number of the circulant matrices C11 to C34 included in the H matrix HM is only an example. The respective circulant matrices C11 to C34 may be square matrices having the same size. Each of the circulant matrices C11 to C34 may be composed of n rows and n columns. When the H matrix HM includes M rows and N columns, each of M and N may correspond to a multiple of n. Therefore, the H matrix HM may be divided into column sections corresponding to the quotient of N divided by n, for example, four column sections CRG1 to CRG4. One column section may include a plurality of circulant matrices corresponding to the quotient of M divided by n, for example, three circulant matrices.

At a part of the positions of the circulant matrices C11 to C34, zero matrices may be arranged.

The circulant matrices C11 to C34 may be generated by circularly shifting an identity matrix as described later.

FIG. 3 is a diagram for describing the structures of the circulant matrices included in the H matrix HM. Each of the circulant matrices C(0), C(1) and C(2) illustrated in FIG. 3 may have a size of 3×3. However, the size is only an example, and the circulant matrices may have various sizes.

The following descriptions will be based on the supposition that the circulant matrices have a size of 3×3.

The circulant matrices may be generated by circularly shifting the identity matrix IM. The circulant matrix C(1) may be generated by circularly shifting the identity matrix IM to the right by "1". The circulant matrix C(2) may be generated by circularly shifting the identity matrix IM to the right by "2".

In the following descriptions, C(x) may be defined as a circulant matrix generated by circularly shifting the identity matrix IM to the right by "x", and "x" may be defined as the shift value of the circulant matrix C(x). The identity matrix IM may be represented by C(0).

The circulant matrices C11 to C34 included in the H matrix HM of FIG. 2 may have different shift values.

FIG. 4 is a diagram for describing a method for converting the H matrix HM into H matrix information HM_IV.

The H matrix HM may be converted into the H matrix information HM_IV containing the positions and shift values of the circulant matrices. Specifically, the position of a circulant matrix 41 may correspond to the position of the element "1" in the first row thereof in the H matrix HM, that is, (i, j). Furthermore, the corresponding shift value "1" of the circulant matrix 41 may be added to convert the circulant matrix 41 into (i, j, 1). In other words, when the shift value "1" of the circulant matrix 41 is known, the positions of the element "1" in the other rows of the circulant matrix 41 can be easily recovered. Thus, the shift value "1" may be contained in the H matrix information HM_IV.

Similarly, the circulant matrix 42 may be converted into (p, q, 0) by adding a shift value "0" to the position (p, q) of the element "1" at the first row of the circulant matrix 42 in the H matrix HM.

Therefore, the H matrix information HM_IV may be inherently equal to the H matrix HM. The H matrix HM may be converted into the H matrix information HM_IV containing a minimum number of values required for recovery, in order to minimize the size of the H matrix HM when stored as data, and the H matrix information HM_IV may be stored in an error correction circuit instead of the H matrix HM.

In accordance with the present embodiment, the size of the H matrix information HM_IV may be further reduced. The advanced H matrix generated by the H matrix generating circuit 10 in accordance with the present embodiment may have a simpler rule, and converted into the H matrix information having a smaller size.

FIG. 5 is a diagram for describing an operating method of the H matrix generating circuit 10 of FIG. 1. In FIG. 5, rectangles forming an original H matrix OHM and an advanced H matrix AHM indicate circulant matrices or zero matrices. The circulant matrices are represented by C(x) as described above, and the zero matrixes are represented by "0".

Referring to FIG. 5, the H matrix generating circuit 10 may receive the original H matrix OHM. The original H matrix OHM may include circulant matrices or zero matrices which are arranged in the row and column directions.

The H matrix generating circuit 10 may generate the advanced H matrix AHM by circularly shifting respective circulant matrices by amounts of corresponding conversion values of column sections. A column section of the H matrix or the advanced H matrix may be a series of circulant matrices located in a column direction in the H matrix or the advanced H matrix. A conversion value corresponding to a certain column section may indicate a shift value for converting the first circulant matrix of the column section into the identity matrix through a circular shift. In FIG. 5, the first circulant matrices of the respective column sections CRG1 to CRG4 may be indicated by solid lines.

For example, the first circulant matrix C(2) of the column section CRG1 needs to be circularly shifted by "−2", in order to convert the first circulant matrix C(2) into the identity matrix. Thus, the conversion value calculation unit 11 may calculate a conversion value corresponding to the column section CRG1 as "−2". Therefore, the shift unit 12 may circularly shift all of the circulant matrices positioned in the column section CRG1 by "−2".

Since the first circulant matrix C(0) of the column section CRG2 is the identity matrix, the conversion value calculation unit 11 may calculate the conversion value corresponding to the column section CRG2 as "0". Therefore, the shift unit 12 may not circularly shift the circulant matrices positioned in the column section CRG2.

The first circulant matrix C(1) of the column section CRG3 needs to be circularly shifted by "−1", until the first circulant matrix C(3) is converted into the identity matrix. Thus, the conversion value calculation unit 11 may calculate the conversion value corresponding to the column section CRG3 as "−1". Therefore, the shift unit 12 may circularly shift all of the circulant matrices positioned in the column section CRG3 by "−1".

Since the first circulant matrix C(0) of the column section CRG4 is an identity matrix, the conversion value calculation unit 11 may calculate the conversion value corresponding to the column section CRG4 as "0". Thus, the shift unit 12 may not circularly shift the circulant matrices positioned in the column section CRG4.

Therefore, all of the first circulant matrices of the column sections CRG1 to CRG4 in the advanced H matrix AHM may be identity matrices C(0). When it is known that the first circulant matrices of the respective column sections CRG1 to CRG4 are identity matrices C(0) in the advanced H matrix AHM, the shift values of the first circulant matrices may not be required.

Therefore, when compared with the advanced H matrix AHM, the H matrix information may contain the positions of the first circulant matrices but not include the shift values (i.e., "0") of the first circulant matrices in the respective column sections CRG1 to CRG4. Furthermore, the H matrix information may contain the positions and shift values of the other circulant matrices in the respective column sections CRG1 to CRG4 of the advanced H matrix in the same manner as described with reference to FIG. 4.

In short, since the advanced H matrix AHM is generated by circularly shifting the column sections CRG1 to CRG4 of the original H matrix OHM, the advanced H matrix AHM may have the same characteristics as the original H matrix OHM. However, the advanced H matrix AHM can be compressed as the H matrix information having a smaller capacity than the original H matrix OHM.

Figure 6:
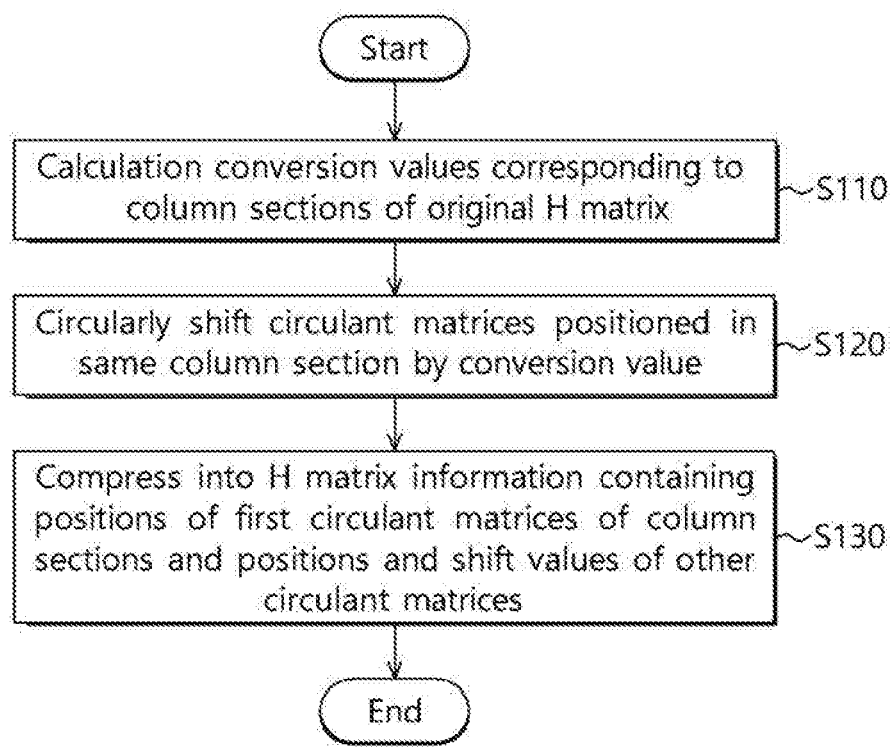
FIG. 6 is a flowchart illustrating the operating method of the H matrix generating circuit of FIG. 1.

FIG. 6 is a flowchart illustrating the operating method of the H matrix generating circuit 10 of FIG. 1.

At step S110, the conversion value calculation unit 11 may calculate conversion values corresponding to the respective column sections of the original H matrix. The conversion value calculation unit 11 may calculate a shift value as a conversion value corresponding to a predetermined column section. The shift value may be used for converting the first circulant matrix of the predetermined column section into an identity matrix through a circular shift.

At step S120, the shift unit 12 may generate an advanced H matrix by circularly shifting circulant matrices positioned in the column sections by the conversion values, respectively. As a result, the shift unit 12 may generate the advanced H matrix, such that the first circulant matrices of the respective column sections become identity matrices in the advanced H matrix.

At step S130, the H matrix generating circuit 10 may compress the advanced H matrix into H matrix information containing the positions of the first circulant matrices and the positions and shift values of the other circulant matrices of the respective column sections of the advanced H matrix, and output the H matrix information.

Figure 7:
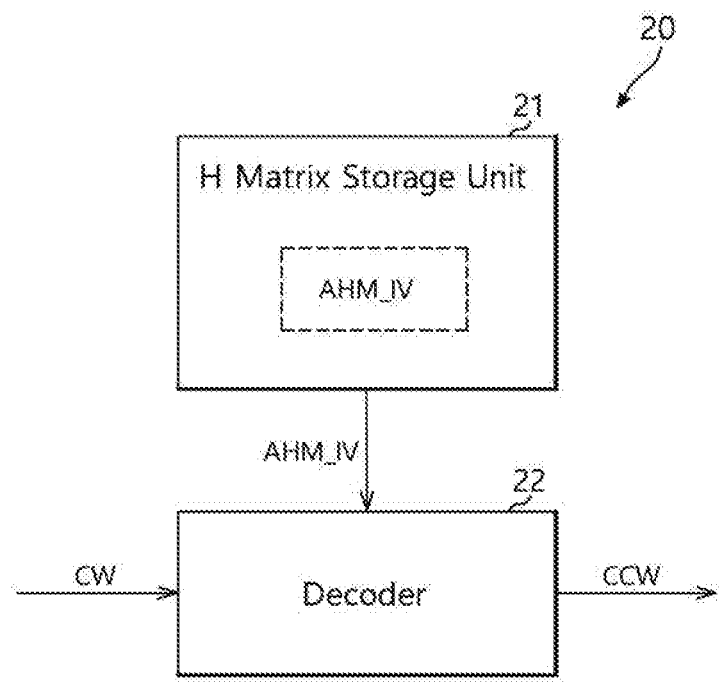
FIG. 7 is a block diagram illustrating an error correction circuit in accordance with an embodiment.

FIG. 7 is a block diagram illustrating an error correction circuit 20 in accordance with an embodiment.

The error correction circuit 20 may include an H matrix storage unit 21 and a decoder 22.

The H matrix storage unit 21 may store H matrix information AHM_IV of a QC-LDPC code. At this time, an H matrix of the QC-LDPC code may be the advanced H matrix which is generated as described with reference to FIGS. 1 to 6. As described above, the advanced H matrix may include identity matrices as the first circulant matrices of the respective column sections thereof. Therefore, the H matrix information AHM_IV may contain the positions of the first circulant matrices and the positions and shift values of the other circulant matrices of the respective column sections of the advanced H matrix. The H matrix information AHM_IV may not contain the shift values of the first circulant matrices of the respective column sections of the advanced H matrix.

The decoder 22 may decode a codeword CW based on the H matrix information AHM_IV stored in the H matrix storage unit 21, and output the error-corrected codeword CCM The decoder 22 may recover all elements of the advanced H matrix based on the H matrix information AHM_IV, and use the recovered elements for the decoding operation.

Figure 8:
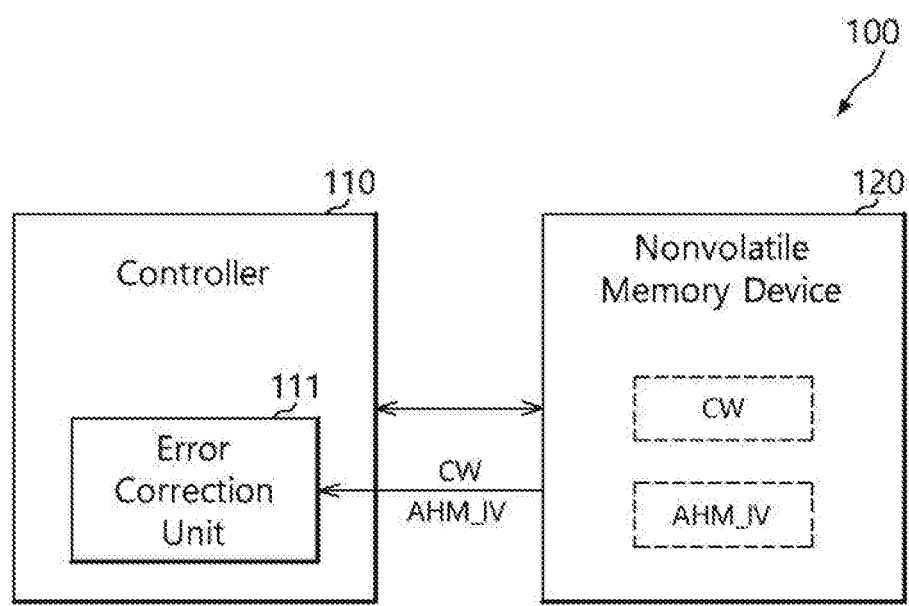
FIG. 8 is a block diagram illustrating a data storage device in accordance with an embodiment.

FIG. 8 is a block diagram illustrating a data storage device 100 in accordance with an embodiment.

The data storage device 100 may store data provided from an external device, in response to a write request of the external device. Furthermore, the data storage device 100 may provide data stored therein to the external device, in response to a read request of the external device.

The data storage device 100 may include a Personal Computer Memory Card International Association (PCM-CIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The data storage device 100 may include a controller 110 and a nonvolatile memory device 120.

The controller 110 may control overall operations of the data storage device 100. The controller 110 may store data in the nonvolatile memory device 120 in response to a write request transmitted from the external device, and read data stored in the nonvolatile memory device 120 and transmit the read data to the external device, in response to a read request transmitted from the external device.

The controller 110 may include an error correction unit 111. The error correction unit 111 may perform a decoding operation on a codeword CW read from the nonvolatile memory device 120 based on an H matrix of a QC-LDCP code. The error correction unit 111 may be configured and operated in substantially the same manner as the error correction circuit 20 illustrated in FIG. 7. The error correction unit 111 may load H matrix information AHM_IV from the nonvolatile memory device 120 to an H matrix storage unit (not illustrated) thereof at the beginning of operation, and use the H matrix information AHM_IV for the decoding operation.

The nonvolatile memory device 120 may store data transmitted from the controller 110, or read data stored therein and transmit the read data to the controller 110, according to control of the controller 110. The nonvolatile memory device 120 may store the H matrix information AHM_IV and the codeword CW.

The nonvolatile memory device 120 may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

FIG. 8 illustrates that the data storage device 100 includes one memory device 120, but the number of memory devices included in the data storage device 100 is not limited thereto.

While various embodiments have been described above, it will be understood to those skilled in the art that the embodiments described are examples only. Accordingly, the operating method of a data storage device described herein should not be limited based on the described embodiments.

What is claimed is:

1. An operating method of an H matrix generation circuit for generating an H matrix of a QC-LDPC code, the operating method comprising:
   calculating, by the H matrix generation circuit, conversion values corresponding to column sections of an original H matrix including a plurality of circulant matrices;
   generating, by the H matrix generation circuit, an advanced H matrix by circularly shifting circulant matrices positioned in column sections of the original U matrix by amounts of the conversion values, respectively; and
   storing H matrix information of the advanced H matrix into a memory using less memory capacity than the original U matrix, the H matrix information being used for performing a decoding operation by an error correction circuit,
   wherein, when the original U matrix includes a column section of which a first circulant matrix is not an identity matrix, the advanced H matrix includes an identity matrix positioned in the same location as the first circulant matrix, the first circulant matrix being an uppermost circulant matrix among circulant matrices included in the column section, and
   wherein the H matrix information of the advanced H matrix contains shift values of the other circulant matrices except for the identity matrix in a column section of the advanced H matrix, and the H matrix information does not contain a shift value of the identity matrix.

2. The operating method of claim 1,
   wherein the calculating of the conversion values comprises calculating shift values as the conversion values corresponding to the respective column sections, and
   wherein the shift values are used for converting first circulant matrices of the column sections into identity matrices through a circular shift, respectively.

3. The operating method of claim 2, wherein the generating of the advanced H matrix comprises generating the advanced H matrix such that the first circulant matrices of the respective column sections in the advanced H matrix are identity matrices.

4. The operating method of claim 1, wherein the H matrix information further contains positions of the other circulant matrices and the identity matrix.

5. An error correction circuit comprising:
- an H matrix storage unit storing H matrix information of a QC-LDPC code; and
- a decoder suitable for performing a decoding operation on a codeword based on the H matrix information,
- wherein the H matrix of the QC-LDPC code includes a plurality of circulant matrices, and first circulant matrices of column sections of the H matrix are set to identity matrices, each of the first circulant matrices being an uppermost circulant matrix among circulant matrices included in a corresponding column section, and
- wherein the H matrix information contains shift values of the other circulant matrices except for the first circulant matrices in the H matrix, and the H matrix information does not contain shift values of the first circulant matrices.

6. The error correction circuit of claim 5, wherein the H matrix information further contains positions of the circulant matrices of the H matrix.

7. The error correction circuit of claim 6, wherein the decoder recovers elements of the H matrix, based on the positions of the first circulant matrices and the positions and shift values of the other circulant matrices.

8. The error correction circuit of claim 5, wherein the H matrix is generated by circularly shifting circulant matrices positioned in column sections of an original H matrix by amounts of conversion values, respectively.

9. The error correction circuit of claim 8, wherein the conversion value corresponding to the column section comprises a shift value for converting the first circulant matrix of the column section into the identity matrix through a circular shift.

10. A memory system comprising:
- a memory device; and
- an ECC unit recovering a first H matrix from H matrix information stored therein, and performing an error-correcting operation for a codeword read from the memory device with the first H matrix,
- wherein the first H matrix is an array of circulant matrices with first circulant matrices being identity matrices in respective column sections thereof, each of the first circulant matrices being an uppermost circulant matrix among circulant matrices included in a corresponding column section, and
- wherein the H matrix information includes positions of the first circulant matrices in the respective column sections and positions and shift values of the other circulant matrices of the first H matrix, and the H matrix information does not contain shift values of the first circulant matrices.

* * * * *